United States Patent
Plevridis

(10) Patent No.: US 8,494,085 B2
(45) Date of Patent: Jul. 23, 2013

(54) METHOD AND SYSTEM FOR BANDWIDTH CALIBRATION FOR A PHASE LOCKED LOOP (PLL)

(75) Inventor: Sofoklis Plevridis, Glyfada (GR)

(73) Assignee: Broadcom Corporation, Irvine, CA (US)

( * ) Notice: Subject to any disclaimer, the term of this patent is extended or adjusted under 35 U.S.C. 154(b) by 441 days.

(21) Appl. No.: 12/824,586

(22) Filed: Jun. 28, 2010

(65) Prior Publication Data

US 2010/0322345 A1    Dec. 23, 2010

Related U.S. Application Data

(63) Continuation of application No. 11/406,629, filed on Apr. 19, 2006, now Pat. No. 7,746,956.

(51) Int. Cl.
| | |
|---|---|
| *H04K 1/02* | (2006.01) |
| *H04L 25/03* | (2006.01) |
| *H04L 25/49* | (2006.01) |

(52) U.S. Cl.
USPC ........... 375/297; 375/296; 375/294; 375/215; 375/327; 375/376; 327/145; 327/156; 342/103; 455/180.3; 455/260

(58) Field of Classification Search
USPC .. 375/297, 296, 294, 215, 327, 376; 327/145, 327/156; 342/103; 455/180.3, 260
See application file for complete search history.

(56) References Cited

U.S. PATENT DOCUMENTS

| | | | | |
|---|---|---|---|---|
| 7,426,377 | B2 * | 9/2008 | Tanaka et al. | 455/255 |
| 7,486,743 | B2 * | 2/2009 | Haiut | 375/296 |
| 2004/0106380 | A1 * | 6/2004 | Vassiliou et al. | 455/73 |
| 2006/0135105 | A1 * | 6/2006 | Jensen | 455/260 |
| 2006/0238226 | A1 * | 10/2006 | Holland et al. | 327/115 |

* cited by examiner

*Primary Examiner* — Shuwang Liu
*Assistant Examiner* — Nader Bolourchi
(74) *Attorney, Agent, or Firm* — Sterne, Kessler, Goldstein & Fox P.L.L.C.

(57) ABSTRACT

Aspects of a method and system for bandwidth calibration for a phase locked loop are presented. Aspects of the method may include generating one or more carrier signals based on one or more corresponding calibration signals. A pre-distortion function may be computed based on the generated one or more carrier signals for the phase locked loop circuit. An output radio frequency (RF) synthesized signal generated by the phase locked loop circuit may be modified based on the computed pre-distortion function and a subsequent output RF synthesized signal generated based on the modified output RF synthesized signal.

18 Claims, 10 Drawing Sheets

METHOD AND SYSTEM FOR BANDWIDTH CALIBRATION FOR A PHASE LOCKED LOOP (PLL)

CROSS-REFERENCE TO RELATED APPLICATIONS/INCORPORATION BY REFERENCE

This application is a continuation of U.S. application Ser. No. 11/06,629 filed Apr. 19, 2006, now U.S. Pat. No. 7,746,956.

This application makes reference to U.S. application Ser. No. 11/385,390 filed on Mar. 21, 2006, now U.S. Pat. No. 7,924,944, which is hereby incorporated herein by reference in its entirety.

FIELD OF THE INVENTION

Certain embodiments of the invention relate to data communications. More specifically, certain embodiments of the invention relate to a method and system for bandwidth calibration for a phase locked loop (PLL).

BACKGROUND OF THE INVENTION

Mobile communications have changed the way people communicate and mobile phones have been transformed from a luxury item to an essential part of every day life. The use of mobile phones today is dictated by social situations, rather than hampered by location or technology. While voice connections fulfill the basic need to communicate, and mobile voice connections continue to filter even further into the fabric of every day life, various integrated mobile multimedia applications, utilizing the mobile Internet, may be the next step in the mobile communication revolution.

Third generation (3G) cellular networks offering various high speed access technologies and mobile telephones that have been specifically designed to utilize these technologies, fulfill demands for integrated multimedia applications supporting TV and audio applications utilizing advanced compression standards, high-resolution gaming applications, musical interfaces, peripheral interface support, etc. The processing requirements are being increased as chip designers take advantage of compression and higher bandwidths to transmit more information. 3G wireless applications support bit rates from 384 kilobits (Kbits)/second to 2 megabits (Mbits)/second, allowing chip designers to provide wireless systems with multimedia capabilities, superior quality, reduced interference, and a wider coverage area.

As mobile multimedia services grow in popularity and usage, factors such as power consumption, cost efficient optimization of network capacity and quality of service (QoS) will become even more essential to cellular operators than it is today. These factors may be achieved with careful network planning and operation, improvements in transmission methods, and advances in receiver techniques and chip integration solutions. To this end, carriers need technologies that will allow them to increase downlink throughput for the mobile multimedia applications support and, in turn, offer advanced QoS capabilities and speeds for consumers of mobile multimedia application services. Currently, mobile multimedia processors may not fully utilize system-on-a-chip (SoC) integration for advanced total system solution for today's mobile handsets. For example, conventional mobile processors may utilize a plurality of hardware accelerators to enable a variety of multimedia applications, which significantly increases power consumption, implementation complexity, mobile processor real estate, and ultimately terminal size.

As mobile terminals support a wider range of content including voice, data and video, they may be required to transmit and/or receive a correspondingly wider range of frequencies. An important aspect in the performance of mobile terminals is the ability to accurately generate signals across the entire range of frequencies associated with signals being transmitted and/or received. For many conventional phased locked loop (PLL) components, the theoretical or idealized performance may differ from the performance observed in actual systems. The result may be a generation of less predictable signals and corresponding degradation in the performance of the mobile terminal when transmitting and/or receiving signals.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for bandwidth calibration for a phase locked loop (PLL), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for bandwidth calibration for a phase locked loop (PLL). Aspects of the method may include generating one or more carrier signals based on one or more corresponding calibration signals. A pre-distortion function may be computed based on the generated one or more carrier signals for the phase locked loop circuit. An output RF synthesized signal generated by the phase locked loop circuit may be modified based on the computed pre-distortion function and a subsequent output RF synthesized signal generated based on the modified output radio frequency (RF) synthesized signal. Various embodiments of the invention may be utilized in a plurality of wireless communications systems including GSM, EDGE, WCDMA, and Bluetooth. The calibration and pre-distortion procedures performed in various embodiments of the invention may be utilized in a plurality of systems which utilize phase locked loop (PLL) circuitry.

A PLL may be utilized for generating signals associated with a specified frequency. In a PLL utilized in a phase modulation transmitter, phase information associated with an input signal may be modulated by the PLL to generate an RF synthesized signal. The RF synthesized signal may be generated from a baseband input signal, in which is referred to as direct modulation, or from an IF input signal, which was generated based on the baseband input signal.

A wide PLL modulation bandwidth may not always be desirable due to spectrum mask limitations and increased noise in the transmitted signal, for example. A narrow PLL bandwidth may cause phase distortion in some circumstances. In many conventional PLL systems, the bandwidth associated with the PLL may be narrower than the bandwidth associated with the input signal. Thus, circuitry may be utilized which pre-distorts the input signal to compensate for the characteristics of the PLL circuitry.

A limitation associated with some conventional PLL circuitry is that the PLL bandwidth may not be known in advance, and may vary during circuit operation. The variations may be due to temperature, power supply variation, and/or component aging, for example. Aspects of various embodiments of the invention may comprise an application of techniques to estimate and adjust PLL bandwidth. The techniques may be applied in real time and/or during circuit operation.

Figure 1A:
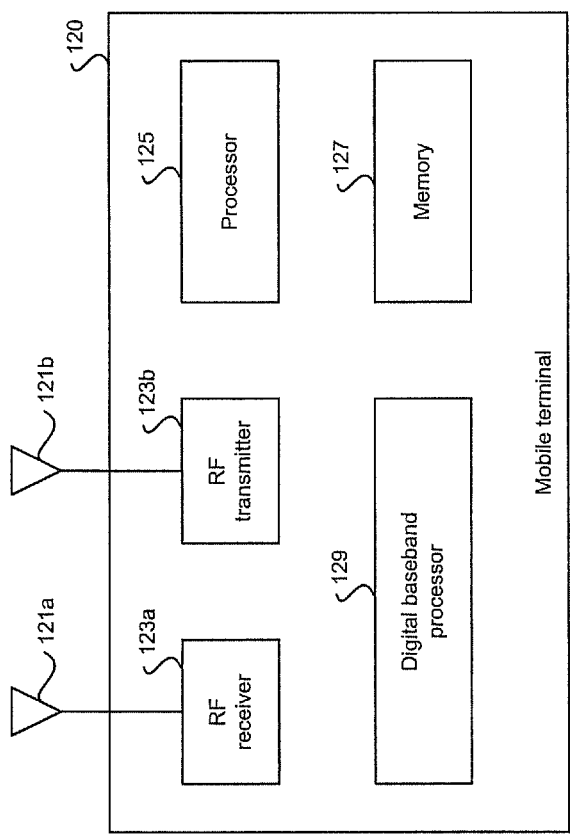
FIG. 1A is a block diagram illustrating an exemplary mobile terminal, in accordance with an embodiment of the invention.

FIG. 1A is a block diagram illustrating an exemplary mobile terminal, in accordance with an embodiment of the invention. Referring to FIG. 1A, there is shown a mobile terminal 120 that may comprise an RF receiver 123a, an RF transmitter 123b, a digital baseband processor 129, a processor 125, and a memory 127. A receive antenna 121a may be communicatively coupled to the RF receiver 123a. A transmit antenna 121b may be communicatively coupled to the RF transmitter 123b.

The mobile terminal 120 may be utilized in an exemplary network such as is disclosed in U.S. patent application Ser. No. 11/385,390 filed on Mar. 21, 2006 and is hereby incorporated herein by reference in its entirety.

The RF receiver 123a may comprise suitable logic, circuitry, and/or code that may enable processing of received RF signals. The RF receiver 123a may enable receiving RF signals in a plurality of frequency bands. The RF receiver 123a may enable receiving signals in cellular and/or Bluetooth frequency bands, for example. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the mobile terminal 120 may comprise more than one RF receiver 123a, wherein each of the RF receiver 123a may be a single-band or a multi-band receiver.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network.

The RF transmitter 123b may comprise suitable logic, circuitry, and/or code that may enable processing of RF signals for transmission. The RF transmitter 123b may enable transmission of RF signals in a plurality of frequency bands. Moreover, the RF transmitter 123b may enable transmitting signals in cellular frequency bands, for example. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the mobile terminal 120 may comprise more than one RF transmitter 123b, wherein each of the RF transmitter 123b may be a single-band or a multi-band transmitter.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120. The processor 125 may also enable executing of applications that may be utilized by the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the mobile terminal 120.

Figure 1B:
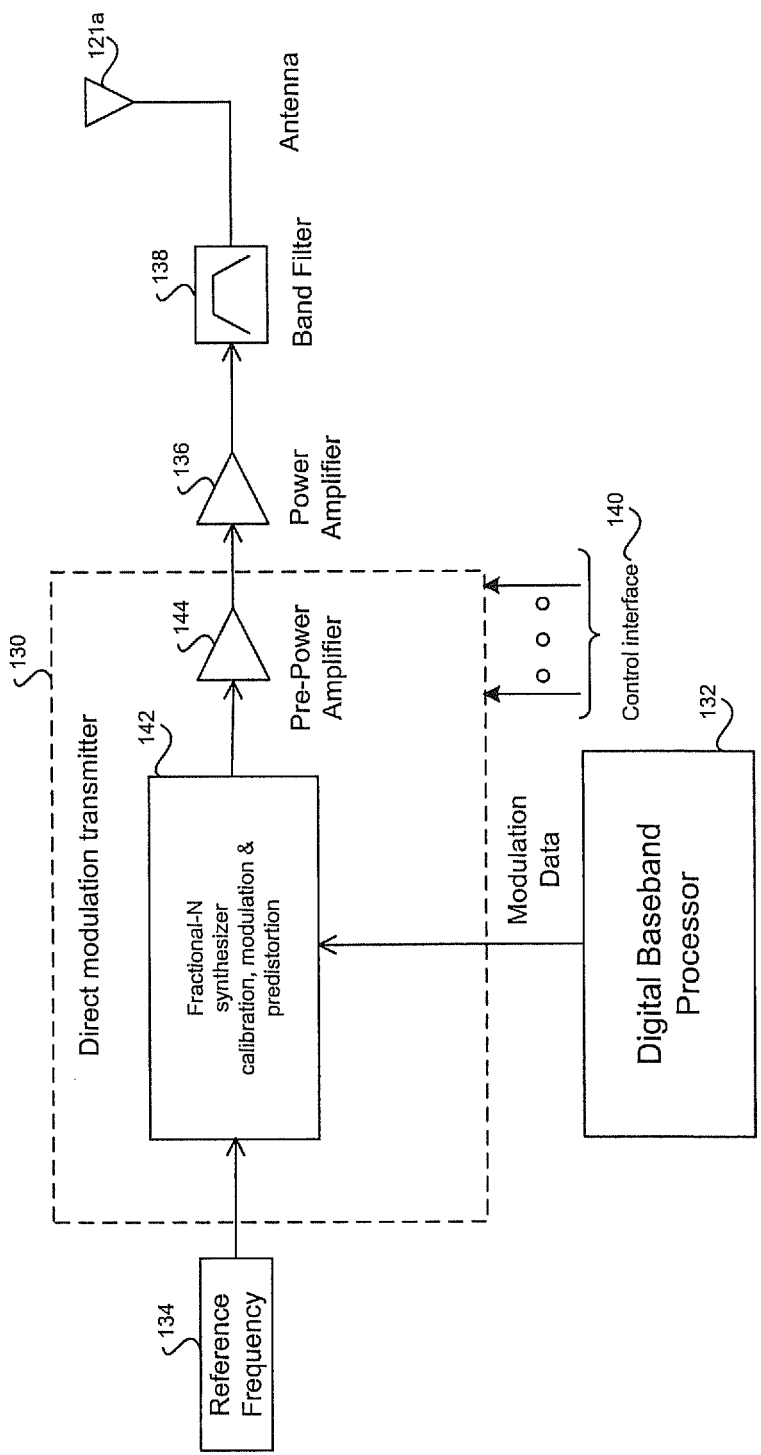
FIG. 1B is a block diagram illustrating an exemplary direct modulation transmitter and digital baseband processor in a mobile terminal, which may be utilized in connection with an embodiment of the invention.

FIG. 1B is a block diagram illustrating an exemplary direct modulation transmitter and digital baseband processor in a mobile terminal, which may be utilized in connection with an embodiment of the invention. Referring to FIG. 1B, there is shown a direct modulation transmitter 130, a digital baseband processor 132, a reference frequency block 134, a power amplifier 136, a bandpass (band) filter 138, a transmit antenna 121b, and a control interface 140. The direct modulation transmitter 130 may comprise a fractional-N synthesizer 142, and a preamplifier (pre-power amplifier) 144. The direct modulation transmitter 130 and/or digital baseband processor 132 may be part of a mobile terminal, such as the mobile terminal 120 in FIG. 1A, for example.

The reference frequency block 134 may comprise suitable logic, circuitry, and/or code that may enable generation of local oscillator (LO) and/or carrier frequency signals. The reference frequency block 134 may comprise a crystal, which may be utilized for generating the LO signals.

The digital baseband processor 132 may comprise suitable logic, circuitry, and/or code that may enable processing and/or handling of baseband frequency signals. The digital baseband processor may output control and/or feedback information. The digital baseband processor 132 may provide modulation data, for example. The modulation data may comprise input data and a modulation type. A modulation type may comprise, for example Gaussian minimum shift keying (GMSK), quaternary phase shift keying (QPSK), and 8 state phase shift keying (8-PSK).

The power amplifier 136 may comprise suitable logic, circuitry, and/or code that may enable generation of an output signal, based on an input signal, with sufficient electrical power that amplitude associated with the output signal may be maintained when the output signal is applied to an electrical load. An exemplary load is a transmit antenna 121b. The power amplifier 136 may be characterized by a linear operation when a change in amplitude for the input signal corresponds to a proportional change in amplitude for the output signal. The proportion may be referred to as gain.

The bandpass filter 138 may comprise suitable logic, circuitry, and/or code that may enable generation of an output signal by processing and input signal to attenuate input signal amplitudes for a range of electromagnetic frequencies below a low frequency, $f_{LOW}$, and above a high frequency, $f_{HIGH}$. The range of frequencies that are greater than or equal to $f_{LOW}$ and less than or equal to $f_{HIGH}$ may comprise a pass band.

The direct modulation transmitter 130 may comprise suitable logic, circuitry, and/or code that may enable generation of an output synthesized RF signal based on a LO signal and modulation data. At least a portion of the circuitry within the direct modulation transmitter 130 may be controlled via the control interface 140. The control interface 140 may be utilized to control the synthesis operations associated with generation of the output synthesized RF signal, and/or amplitude associated with the output synthesized RF signal, for example.

The fractional-N synthesizer 142 may comprise suitable logic, circuitry, and/or code that may enable utilization of the modulation data to generate a synthesized RF signal. The modulation data may comprise input data, and information specifying a modulation type. The synthesized RF signal may comprise a plurality of symbols, wherein a symbol may comprise a portion of bits associated with the input data. The number of input data bits associated with a symbol may be based on the modulation type. The input data may comprise a digital baseband signal. The fractional-N synthesizer 142 may generate the synthesized RF signal directly based on the digital baseband signal without generating an IF signal.

The fractional-N synthesizer 142 may generate a change in signal level and/or frequency for the synthesized RF signal based on a corresponding change in the input data. The fractional-N synthesizer 142 may perform calibration and predistortion procedures to equalize the corresponding change across a range of frequencies, which characterize a signal associated with the input data. The calibration procedures may enable the fractional-N synthesizer 142 to measure the extent to which a value associated with the corresponding change varies across the range of frequencies. The pre-distortion procedures may modify parameters associated with the fractional-N synthesizer 142 to reduce variations in changes in signal level and/or frequency for the synthesized RF signal based on corresponding changes in the input data.

The preamplifier 144 may comprise suitable logic, circuitry, and/or code that may enable generation of an output signal variable attenuation for a signal level associated with an input signal. The preamplifier 144 may vary the attenuation applied to the input signal based on a signal applied to the control interface 140, for example.

In operation, the digital baseband processor 132 may provide a baseband signal comprising input data and information corresponding to a modulation type to the fractional-N synthesizer 142. The baseband signal may comprise a digital representation of the input data. The modulation type may be utilized to convert the digital representation of the input data to an analog representation comprising a plurality of symbols. Each symbol may comprise a portion of bits contained in the digital representation of the input data.

Utilizing a LO signal and/or carrier frequency signal from the reference frequency block 134, the fractional-N synthesizer 142 may modulate the received broadband signal to generate an RF synthesized signal. The frequency associated with the RF synthesized signal may be based on the carrier frequency.

The amplitude associated with the RF synthesized signal may be modified by the preamplifier 144. The amplitude modified RF synthesized signal may comprise an output RF synthesized signal. The amplitude associated with the output RF synthesized signal may be modified by the power amplifier 136. The output RF synthesized signal may comprise signal components that span a range of frequencies. The bandpass filter 138 may bandlimit the amplified output RF synthesized signal by reducing signal levels for signal components associated with frequencies that are not within the pass band for the bandpass filter 138. The transmit antenna 121b may enable the bandlimited signal to be transmitted via a wireless medium.

Figure 1C:
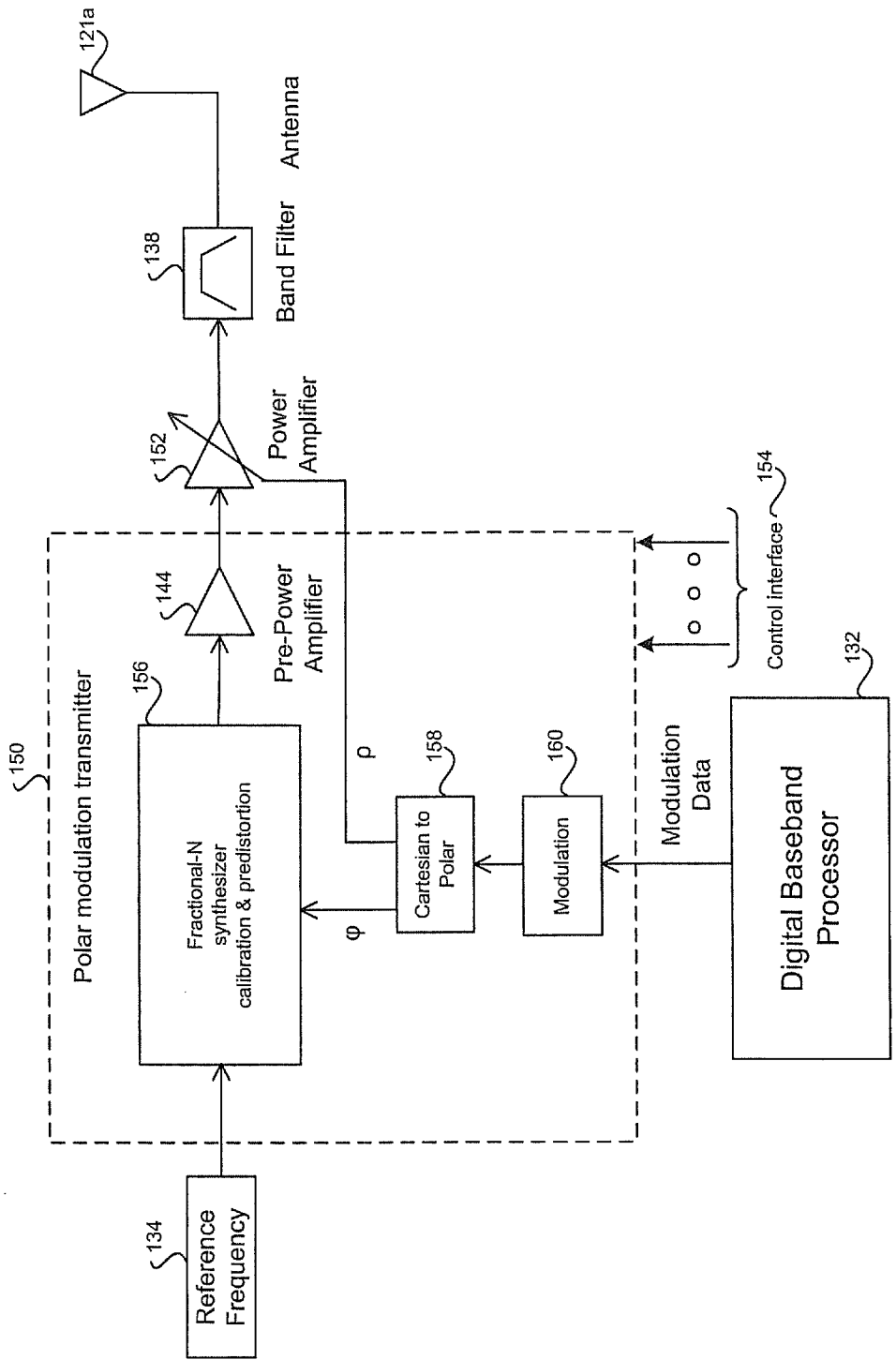
FIG. 1C is a block diagram illustrating an exemplary polar modulation transmitter with intermediate frequency (IF) modulation and digital baseband processor, which may be utilized in connection with an embodiment of the invention.

FIG. 1C is a block diagram illustrating an exemplary polar modulation transmitter with intermediate frequency (IF) modulation and digital baseband processor, which may be utilized in connection with an embodiment of the invention.

Referring to FIG. 1C, there is shown a polar modulation transmitter 150, a digital baseband processor 132, a reference frequency block 134, a power amplifier 152, a bandpass (band) filter 138, a transmit antenna 121b, and a control interface 154. The polar modulation transmitter 150 may comprise a fractional-N synthesizer 156, a preamplifier (pre-power amplifier) 144, a Cartesian to polar conversion block 158, and a modulation block 160. The polar modulation transmitter 160 and/or digital baseband processor 132 may be part of a mobile terminal, such as the mobile terminal 120 in FIG. 1A, for example. The reference frequency block 134, digital baseband processor 132, bandpass filter 138, and preamplifier block 144 may be substantially as described in FIG. 1B.

The power amplifier 152 may comprise suitable logic, circuitry, and/or code that may enable generation of an output signal, based on an input signal, with sufficient electrical power that amplitude associated with the output signal may be maintained when the output signal is applied to an electrical load. The power amplifier 152 may be characterized by a linear operation when a change in amplitude for the input signal corresponds to a proportional change in amplitude for the output signal. The gain associated with the power amplifier 152 may be variable based on a received gain control input signal.

The polar modulation transmitter 150 may comprise suitable logic, circuitry, and/or code that may enable generation of an output synthesized RF signal based on a LO signal and modulation data. At least a portion of the circuitry within the polar modulation transmitter 150 may be controlled via the control interface 154. The control interface 154 may be utilized to control the synthesis operations associated with generation of the output synthesized RF signal, and/or amplitude associated with the output synthesized RF signal, for example.

The modulation block 160 may comprise suitable logic, circuitry, and/or code that may enable the utilization of the modulation data to generate an IF signal. The modulation data may comprise input data, and information specifying a modulation type. The IF signal may comprise a plurality of symbols, wherein a symbol may comprise a portion of bits associated with the input data. The number of input data bits associated with a symbol may be based on the modulation type. The input data may comprise a digital baseband signal. The modulation block may generate the IF signal based on the digital baseband signal. The IF signal may comprise an in (I) phase component, and a quadrature (Q) phase component.

The Cartesian to polar conversion block 158 may comprise suitable logic, circuitry, and/or code that may enable generation of magnitude and phase components corresponding to a received input signal. The Cartesian to polar conversion block 158 may receive an IF input signal comprising I and Q components. The Cartesian to polar conversion block 158 may generate a representation of the input signal that comprises a magnitude ($\rho$) component, and a phase ($\phi$) component. The magnitude component may represent amplitude modulated signal component, and the phase component may represent a phase modulated signal component.

The fractional-N synthesizer 156 may comprise suitable logic, circuitry, and/or code that may enable utilization of the phase modulated signal component to generate a synthesized RF signal. The fractional-N synthesizer 156 may generate the synthesized RF signal based on an input IF signal. The fractional-N synthesizer 156 may generate a change in signal level and/or frequency for the synthesized RF signal based on a corresponding change in the input IF signal. The fractional-N synthesizer 156 may perform calibration and predistortion procedures to equalize the corresponding change across a range of frequencies, substantially as described for the fractional-N synthesizer 142.

In operation, the digital baseband processor 132 may provide a baseband signal comprising input data and information corresponding to a modulation type to the modulation block 160. The modulation block 160 may utilized an IF carrier signal to modulate the baseband signal. The frequency associated with the IF carrier signal may be predetermined, for example 10.7 MHz. The resulting IF signal may comprise a plurality of symbols, wherein the symbols may be generated based on the modulation type associated with the input data. The IF signal generated by the modulation block 160 may comprise I and Q signal components.

The I and Q components may be communicated to the Cartesian to polar conversion block 158. The Cartesian to polar conversion block 158 may generate magnitude and phase signal components which correspond to the received I and Q signal components. The phase signal component may be communicated to the fractional-N synthesizer 156. The fractional-N synthesizer 156 may utilize the phase signal component, and the LO signal and/or carrier frequency signal from the reference frequency block 134, to generate an RF synthesized signal. The frequency associated with the RF synthesized signal may be based on the carrier frequency derived from an input signal received from the reference frequency block 134.

The amplitude associated with the RF synthesized signal may be modified by the preamplifier 144. The amplitude modified RF synthesized signal may comprise an output RF synthesized signal. The amplitude associated with the output RF synthesized signal may be modified by the power amplifier 136. The power amplifier 136 may modify the amplitude associated with the output RF synthesized signal based on the magnitude component signal, received from the Cartesian to polar conversion block 158. The output RF synthesized signal may comprise signal components that span a range of frequencies. The bandpass filter 138 may bandlimit the amplified output RF synthesized signal by reducing signal levels for signal components associated with frequencies that are not within the pass band for the bandpass filter 138. The transmit antenna 121b may enable the bandlimited signal to be transmitted via a wireless medium.

Figure 2:
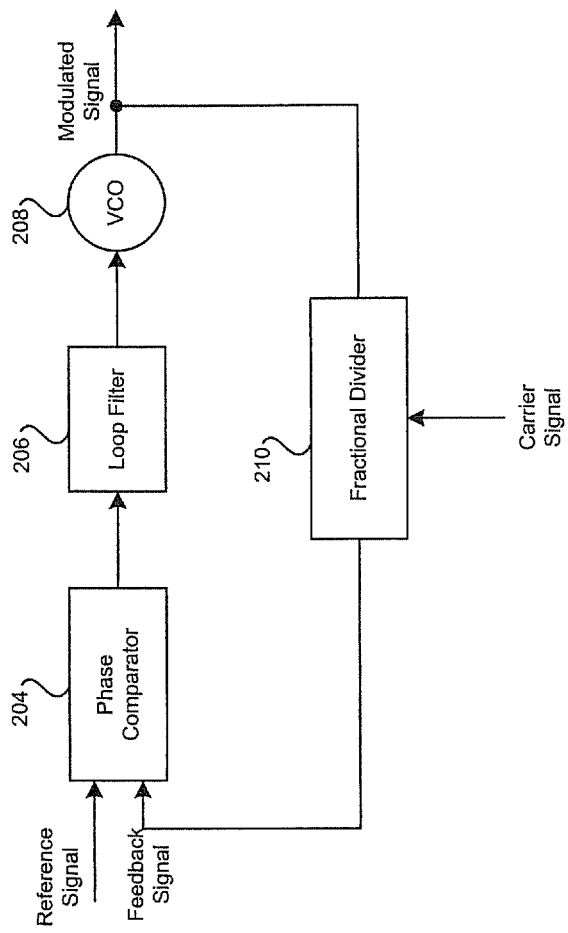
FIG. 2 is a block diagram of an exemplary phase locked loop (PLL) circuit, which may be utilized in connection with an embodiment of the invention.

FIG. 2 is a block diagram of an exemplary phase locked loop (PLL) circuit, which may be utilized in connection with an embodiment of the invention. Referring to FIG. 2 there is shown a phase comparator block 204, a loop filter block 206, a voltage controlled oscillator (VCO) block 208, and a fractional divider block 210. Also shown in FIG. 2 are a Reference signal, a Feedback signal, a Modulated signal, and a Carrier signal. The Reference signal may be generated by applying a voltage to a crystal oscillator in a process that may be referred to as modulation.

The phase comparator block 204 may comprise suitable circuitry, logic, and/or code that may be utilized to enable generation of a current, i(f), based on the Reference signal and the Feedback signal. The variable, f, may refer to a frequency associated with the current i(f) signal. The value of the current, as measured in milliamperes (ma) for example, may vary based on the frequency. The phase comparator block 204 may comprise a phase comparator function and a charge pump function. The phase comparator function in the phase comparator block 204 may be utilized to enable generation of a signal based on a phase difference between the Reference signal and the Feedback signal. The charge pump function in the phase comparator block 204 may be utilized to enable generation of the current i(f) based on the generated signal. The generation of the frequency dependent i(f) signal based on the phase difference between the Reference and Feedback signals may be referred to as phase modulation.

The average direct current (DC) value associated with the current i(f), $I_{DC}$, may be based on the phase difference between the Reference signal and the Feedback signal, where the variable, f, may represent a frequency associated with the generated signal upon which the value associated with the current i(f) may depend. For a DC value, the value associated with the frequency, f, may be about equal to 0.

The loop filter 206 may comprise suitable circuitry, logic, and/or code that may be utilized to enable generation of a control voltage $V_{Cntl}$ based on the current i(f). The loop filter 206 may be characterized by an impedance that varies as a function of frequency, $Z_{loop}(f)$, where the variable f may represent the frequency of a signal applied to the loop filter 206. An approximate value associated with control voltage $V_{Cntl}$ may be represented by a DC value as shown in the following equation:

$$V_{Cntl} = R_{loop} I_{DC} \quad \text{equation[1]}$$

where $R_{loop}$ may correspond to a DC value associated with the impedance $Z_{loop}(f)$.

The VCO 208 may comprise suitable circuitry, logic, and/or code that may be utilized to enable generation of the Modulated signal based on the control voltage $V_{Cntl}$ based on a process that may be referred to as modulation. The Modulated signal may be utilized as an output RF synthesized signal within the transmitter 130 or 150. The definition of the Modulated signal may comprise an amplitude, $A_{mod}$, a phase, $\Phi_{mod}$, and/or a frequency, $f_{mod}$.

The fractional divider block 210 may comprise suitable circuitry, logic, and/or code that may be utilized to generate the Feedback signal based on the Modulated signal and/or the Carrier signal. The definition of the Feedback signal may comprise an amplitude, $A_{Feedback}$, a phase, $\Phi_{Feedback}$, and/or a frequency, $f_{Feedback}$. The frequency associated with the Modulated signal may be a multiple of the frequency associated with the Feedback signal. The period of the frequency associated with the Modulated signal may be a corresponding fraction of the period of the frequency associated with the Feedback signal. In various embodiments of the invention, the amplitude and/or phase associated with the Modulated signal may be modified, based on modulated information communicated via the Carrier signal, to generate the Feedback signal. The modulated information may be generated based on digital information in a process referred to as digital modulation.

In operation, the fractional divider block 210 may divide the frequency and/or modify the magnitude and/or phase associated with the Modulated signal received from the VCO block 208, based on the Carrier signal, to generate an Feedback signal. The phase comparator block 204 may compare a phase associated with the Reference signal and a phase associated with the Feedback signal received from the fractional divider block 210 to generate a current i(f). The loop filter block 206 may utilize the current i(f), received from the phase comparator block 204, to generate a control voltage $V_{Cntl}$. The VCO block 208 may generate a Modulated signal whose frequency may be based on the control voltage, $V_{Cntl}$, received from the loop filter block 206.

The phase locked loop (PLL) circuit, as illustrated in FIG. 2, may utilize a feedback loop that enables a subsequent output RF synthesized signal to be generated based on an output RF synthesized signal. The output RF synthesized signal generated by the VCO 208 may be frequency divided and/or amplitude and/or phase modified by the fractional divider 210. The frequency divided and/or amplitude and/or phase modified signal may be input to the phase comparator 204 where the phase associated with the frequency divided and/or amplitude and/or phase modified signal may be compared to a corresponding phase associated with a Reference signal. Based on the phase comparison, a subsequent control voltage $V_{Cntl}$ may be applied to the input of the VCO 208. The VCO 208 may generate the subsequent output RF synthesized signal.

The Feedback signal amplitude, $A_{Feedback}$, and phase, $\Phi_{Feedback}$, may each vary as a function of the frequency $jf_{Feedback}$ and the bandwidth frequency $f_{BW}$ and may be represented $A_{Feedback}(f_{Feedback}, f_{BW})$, and $\Phi_{Feedback}(f_{Feedback}, f_{BW})$, respectively. A transfer function, $H_{FB}(f, f_{BW})$, may be utilized to represent values associated with the signal amplitude $A_{Feedback}(f_{Feedback}, f_{BW})$ as a function of the frequency $f_{Feedback}$ and the bandwidth frequency $f_{BW}$ for the PLL as measured at the output from the fractional divider 210, for example. The transfer function $H_{FB}(f, f_{BW})$ may represent a functional relationship between the Carrier frequency signal ($f_{sel}$) input to the fractional divider 210 and the Feedback signal output from the fractional divider block 210 as in the following equation, for example:

$$FeedbackSignal(f, f_{BW}) = H_{FB}(f, f_{BW}) \cdot CarrierSignal(f) \quad \text{equation [2a]}$$

$$\text{where } H_{FB}(f, f_{BW}) = \frac{1}{f \cdot f_{sel}} \cdot \frac{1}{1 + f_{bw} \cdot Z_{loop}(f)} \quad \text{equation [2b]}$$

where the Feedback signal may be represented as comprising values that may vary according to frequency, f and $f_{BW}$ and Carrier signal may be represented as comprising values that may vary according to frequency f.

The transfer function $H_{FB}(f, f_{BW})$ may be characterized by a range of frequencies referred to as a bandwidth ($f_{BW}$). The bandwidth may be defined in a range of frequencies around the ideal bandwidth $f_{BWideal}$ for example $$f_{min} \leq f_{BWideal} \leq f_{max} \quad \text{equation[3a]}$$

for which $f_{min}$ and $f_{max}$ could be a proportion of the ideal bandwidth $f_{BWideal}$ for example $$f_{min} \approx 50\% f_{BWideal} \text{ and } f_{max} \approx 150\% f_{BWideal} \quad \text{equation[3b]}$$

where $f_{min}$ may represent a minimum frequency within the bandwidth and $f_{max}$ may represent a maximum frequency within the bandwidth.

A PLL design may be based upon an ideal transfer function $h_{ideal}(f)$, but actual embodiments of the PLL design may be characterized by an actual transfer function $h_{act}(f)$, where $h_{act}(f) \neq h_{ideal}(f)$ within a range of frequencies f. As a result, in some conventional RF transmitters, values for amplitude, phase, and/or frequency associated with generated output RF synthesized signals may deviate from corresponding ideal values within the range of frequencies.

In various embodiments of the invention, the actual transfer function $h_{act}(f)$ may be estimated and compared with the ideal transfer function $h_{ideal}(f)$ within a range of bandwidth frequencies $f_{BW}$. The range of bandwidth frequencies may comprise at least a portion of the bandwidth defined by the frequencies $f_{min}$ and $f_{max}$. Based on the comparison, modulated information may be incorporated into the Carrier signal such that the actual transfer function may comprise an approximate representation of the ideal transfer function such that $h_{act}(f) \approx h_{ideal}(f)$. The actual transfer function may comprise an approximate representation of the ideal transfer function within a defined range of frequencies that comprise a bandwidth. The process by which the actual transfer function $h_{act}(f)$ is modified to approximate the ideal transfer function $h_{ideal}(f)$ may be referred to as equalization. The process by which modulation information is computed, based on the equalization, and incorporated into the Carrier signal to adjust the behavior of a PLL, may be referred to as calibration. A calibration that may be utilized across a range of frequencies comprising a bandwidth may be referred to as a bandwidth calibration. Various embodiments of the invention may comprise a method and system for bandwidth calibration for a phase locked loop.

Figure 3:
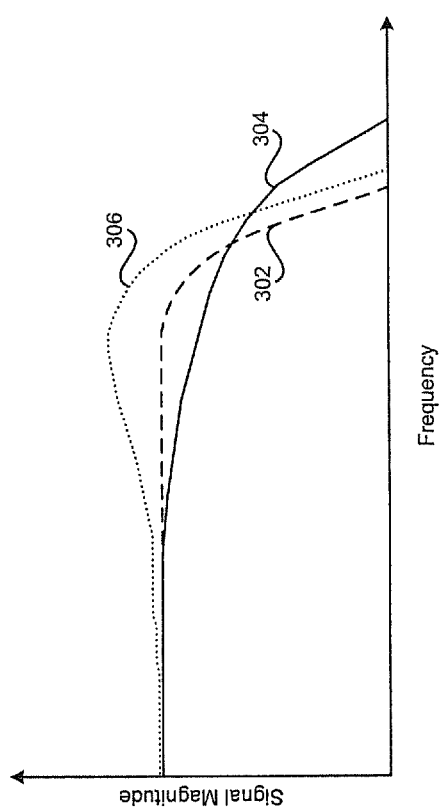
FIG. 3 is an exemplary illustration of equalization of a transfer function, which may be utilized in connection with an embodiment of the invention.

FIG. 3 is an exemplary illustration of equalization of a transfer function, which may be utilized in connection with an embodiment of the invention. With reference to FIG. 3, there is shown an ideal transfer function 302, an actual transfer function 304, and a pre-distortion function 306. The ideal transfer function 302, actual transfer function 304, and pre-distortion function 306 are shown as functions of frequency in the horizontal axis. The vertical axis shows signal amplitudes in response to exemplary signals associated with the range of frequencies shown in the horizontal axis, for example.

The ideal transfer function 302 may represent the transfer function $h_{ideal}(f)$ in response to exemplary signals, for example, calibration signals in an ideal PLL. The calibration signal may be communicated to the PLL via the Carrier signal input to the fractional divider 210. The response may be as measured in the Feedback signal (FIG. 2) output from the fractional divider 210. The actual transfer function 304 may represent the transfer function $h_{act}(f)$ in response to the exemplary signals in an embodiment of the ideal PLL. The pre-distortion function 306 may represent calibration information that may be incorporated, as modulation information, in the Carrier signal input to the fractional divider 210. As a result of the incorporation of the calibration information, the transfer function, in response to the exemplary signals in an embodiment of the ideal PLL may approximate the ideal transfer function response $h_{ideal}(f)$.

Figure 4:
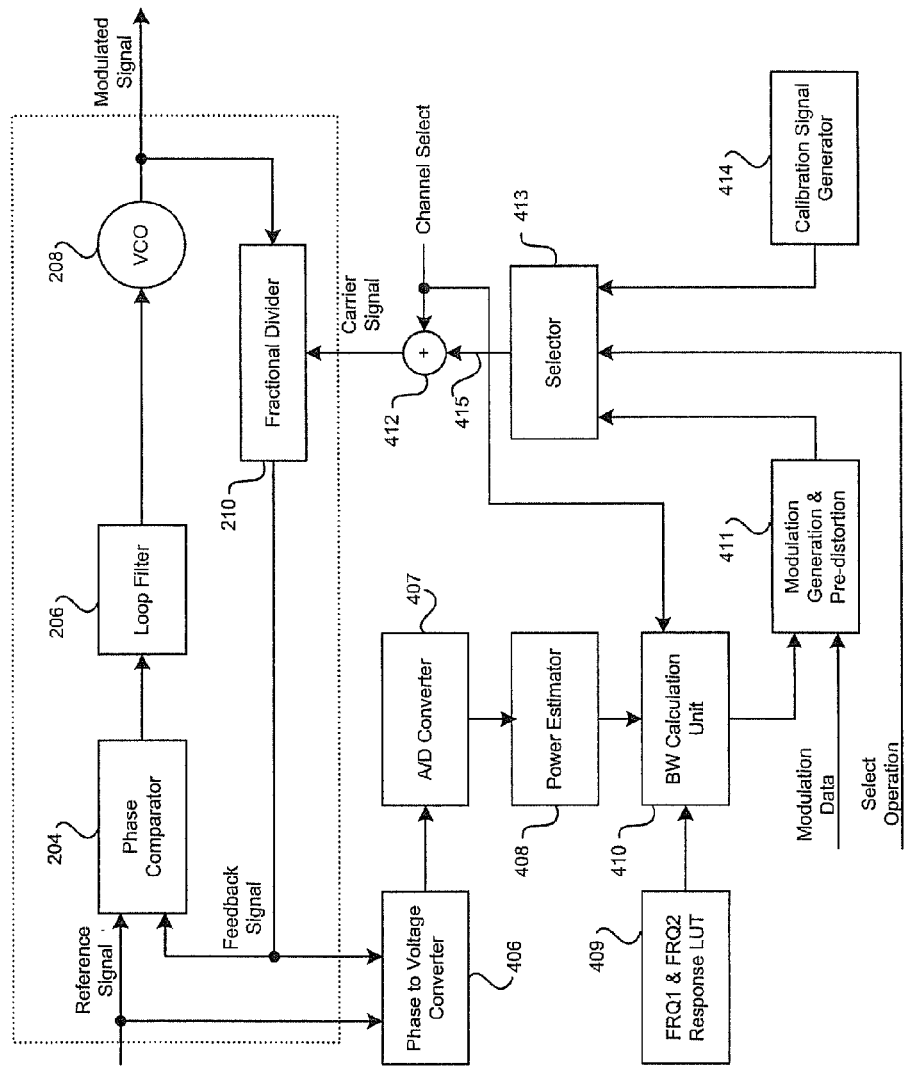
FIG. 4 is a block diagram of an exemplary system for bandwidth calibration for a phase locked loop, in accordance with an embodiment of the invention.

FIG. 4 is a block diagram of an exemplary system for bandwidth calibration for a phase locked loop, in accordance with an embodiment of the invention. Referring to FIG. 4, there is shown a phase comparator block 204, a loop filter block 206, a voltage controlled oscillator (VCO) block 208, a fractional divider block 210, a phase to voltage converter block 406, an analog to digital (ND) converter block 407, a power estimator block 408, a frequency response lookup table (LUT) 409, a bandwidth (BW) calculation unit 410, a modulation generation and pre-distortion block 411, a calibration signal generator block 414, a selector block 413, modulation information 415, and an adder block 412. Also shown in FIG. 4, is a Reference signal, Feedback signal, Modulated signal, Carrier signal, Channel Select signal, Select Operation signal, and Modulation data. The phase comparator block 204, a loop filter block 206, voltage controlled oscillator (VCO) block 208, fractional divider block 210, Reference signal, Feedback signal, Carrier signal, and Modulation signal may be substantially as described in FIG. 2.

The phase to voltage converter block 406 may comprise suitable circuitry, logic, and/or code that may be utilized to enable generation of a voltage, v(t), based on the Reference signal and the Feedback signal. The variable, t, may refer to time as measured in seconds, for example. The voltage v(t) may be measured in volts, for example, the value of which may vary based on the corresponding value associated with the variable, t. The voltage v(t) may be represented as an analog signal. The phase to voltage converter block 406 may be utilized to enable generation of the analog signal v(t) based on a phase difference between the Reference signal and the Feedback signal.

The A/D converter block 407 may comprise suitable circuitry, logic, and/or code that may be utilized to enable generation of a digital signal based on a received analog signal. The A/D converter block 407 may receive the analog signal v(t) and sample the signal at successive time instants separated in time by a time duration T. The successive samples may be numbered according to an index n, where n may comprise values 0, 1, 2, . . . , for example. The corresponding time instants at which samples may be taken for the signal v(t) may correspond to values for the index n; t=0, T, 2T, . . . , nT. The sample may comprise determining the signal level values associated with the voltage v(t), at time instants t=nT. Each signal level value may be converted into a digital representation comprising one or more binary bits, for example. The digital signal v[n] may comprise a digital representation of a signal level value for the analog signal v(nT). Each value v[n] may represent a digital sample for the corresponding analog signal v(t) for values of the index n=0, 1, 2 . . .

The power estimator block 408 may comprise suitable circuitry, logic, and/or code that may be utilized to enable computation of a signal power level associated with a received signal. In an embodiment of the invention, the received signal may be a digital signal v[n], for example. The power estimator block 408 may compute a signal power level based on a plurality of samples v[n]. The signal power level based on a plurality of samples v[n] may be computed based on a summation of computed power levels associated with each individual sample v[n]. A signal power level computed based on a single sample v[n] may be referred to as an instantaneous power level, for example. An instantaneous power level associated with the single sample v[n] may be defined as in the following equation, for example:

$$\text{Instantaneous Power} = (v[n])^2 \qquad \text{equation[4a]}$$

where n may refer to an individual sample n. A continuous power level, computed for a plurality of samples v[n], may be defined as in the following equation, for example:

$$\text{Continuous Power} = \sum_{n=n_{min}}^{n_{max}} (v[n])^2 \qquad \text{equation [4b]}$$

where $n_{min}$ may indicate a sample that marks the beginning of a continuous power measurement interval, while $n_{max}$ may indicate a sample that marks the end.

In various other embodiments of the invention, the power estimator block 408 may compute a signal power level associated with the received signal based on one or more frequencies contained in the received signal. For example, the power estimator block 408 may compute a signal power level associated with a corresponding one or more frequencies, f.

The LUT 409 may comprise suitable circuitry, logic, and/or code that may be utilized to enable storage and/or retrieval, of reference information. The reference information may, for example, describe an ideal transfer function, $h_{ideal}(f)$, when evaluated at frequencies f=frq1 and/or f=frq2 for a number of frequency bandwidths $f_{BW}$ around the ideal bandwidth $f_{BWideal}$ as defined by equations [3a] and [3b] By utilizing equations [2a] and [2b], for example, the reference information describing $H_{FB}(\text{frq1}, f_{BW})$ may be utilized to determine ideal values for amplitude $A_{Feedback}(\text{frq1}, f_{Bw})$, and $\Phi_{Feedback}(\text{frq1}, f_{BW})$ associated with the Feedback signal, FeedbackSignal(frq1,$f_{BW}$), in response to a given calibration signal, CalibrationSignal(frq1). Similarly, the reference information describing $H_{FB}(\text{frq2},f_{BW})$ may be utilized to determine ideal values for amplitude $A_{Feedback}(\text{frq2},f_{Bw})$, and $\Phi_{Feedback}(\text{frq2},f_{BW})$ associated with the Modulation signal FeedbackSignal (frq2,$f_{BW}$), in response to a given calibration signal CalibrationSignal(frq2).

Values associated with the ideal transfer function $h_{ideal}(f)$ may be based on a signal power level, computed based on the Feedback signal, where the Feedback signal was computed based on the Carrier signal, which in turn was computed based on a given calibration signal. For example, given a calibration signal whose associated frequency is about f=frq2, values associated with the ideal transfer function, $h_{ideal}(f)$, based on a calibration signal may be computed based on the following equation:

$$h_{ideal}(frq2) = \frac{PowerIdeal[FeedbackSignal(frq2)]}{PowerIdeal[CarrierSignal(frq2)]} \quad \text{equation [5]}$$

where PowerIdeal[x] may represent an computed signal power level associated with the signal x based on an ideal PLL. The calculations PowerIdeal[x] may be based on digital representations for signals, x. A similar calculation may be performed for a given calibration signal whose associated frequency is about f=frq1.

The BW calculation unit 410 may comprise suitable circuitry, logic, and/or code that may be utilized to enable calculation of bandwidth measurements in a PLL. The calculations may, for example, comprise determining estimated values associated with an actual transfer function $h_{actual}(f)$ when evaluated at frequencies f=frq1, f=frq2, and/or at a selected channel frequency, $f_{Sel}$. The selected channel frequency, $f_{Sel}$, may be based on the Channel Select signal.

The BW calculation unit 410 may calculate estimated values associated with the actual transfer function $h_{actual}(f)$ based on a calibration signal. When calculating estimated values associated with the actual transfer function $h_{actual}(f)$ based on a calibration signal, the BW calculation unit 410 may compare a signal power level, computed based on the Feedback signal, where the Modulation signal was generated based on the Carrier signal, which in turn was generated based on the calibration signal. For example, given a calibration signal whose associated frequency is about f=frq2, estimated values associated with the actual transfer function $h_{actual}(f)$, Est[$h_{actual}(f)$], based on a calibration signal may be computed based on the following equation:

$$Est[h_{actual}(frq2)] = \frac{PowerEst[FeedbackSignal(frq2)]}{PowerEst[CarrierSignal(frq2)]} \quad \text{equation [6]}$$

where PowerEst[x] may represent an estimated signal power level associated with the signal x. The calculations PowerEst[x] may be based on digital representations for signals x. A similar calculation may be performed for a given calibration signal whose associated frequency is about f=frq1.

The BW calculation unit 410 may also receive stored reference information associated with the ideal transfer function $h_{ideal}(f)$ as an input. The BW calculation unit 410 may compute an impairment parameter, Impairment(f), as shown in the following equation, for example:

$$\text{Impairment}(f) = h_{actual}(f) - h_{ideal}(f) \quad \text{equation[7]}$$

where the value for the impairment may be represented as a function of the frequency f.

In various embodiments of the invention, bandwidth calibration may be computed for a PLL 174 when utilizing calibration signals based on equations[5], [6], and [7] when computed for values f=frq1 and f=frq2, for example.

The BW calculation unit 410 may calculate estimated values associated with the actual transfer function $h_{actual}(f)$ based on a signal received by the transmitter 130 or 150. The selected channel frequency, $f_{Sel}$, may be associated with the signal being transmitted by the transmitter 130 or 150. When calculating estimated values associated with the actual transfer function $h_{actual}(f)$ based on the received signal, the BW calculation unit 410 may compare a signal power level, computed based on the Feedback signal, where the Feedback signal was generated based on the Carrier signal, which in turn was generated based on the received signal. For example, given a received signal whose associated frequency is about f=$f_{Sel}$, estimated values associated with the actual transfer function $h_{actual}(f)$, Est[$h_{actual}(f)$], based on a received signal may be computed based on the following equation:

$$Est[h_{actual}(f_{Sel})] = \frac{PowerEst[FeedbackSignal(f_{Sel})]}{PowerEst[CarrierSignal(f_{Sel})]} \quad \text{equation [8]}$$

An expectation value for the ideal transfer function, Exp[$h_{ideal}(f_{Sel})$], may be computed based on corresponding values $h_{ideal}(\text{frq1})$ and/or $h_{ideal}(\text{frq2})$, for example. Based on the expectation value, the BW calculation unit 410 may compute the impairment parameter as shown in the following equation, for example:

$$\text{Impairment}(f_{Sel}) = h_{actual}(f_{Sel}) - \text{Exp}[h_{ideal}(f_{Sel})] \quad \text{equation[9]}$$

In various embodiments of the invention, a bandwidth calibration may be computed for a PLL when utilizing received and/or calibration signals based on equations[8] and [9], and on equation[5] when computed for f=frq1 or f=frq2, for example.

The modulation generation and pre-distortion block 411 may comprise suitable circuitry, logic, and/or code that may be utilized to enable generation an analog pre-distortion signal based on received digital impairment information and modulation data. The modulation generation and pre-distortion block 411 may implement a pre-distortion function by utilizing received digital impairment information and modulation data to generate an analog pre-distortion signal. The modulation data may comprise information related to constellation points associated with a modulation type that may be utilized in performing A/D conversion on a signal being transmitted by the transmitter 130 or 150, for example. Exemplary modulation types may include variations of the phase shift keying (PSK), minimum shift key (MSK) and quadrature amplitude modulation (QAM) methods.

The calibration signal generator block 414 may comprise suitable circuitry, logic, and/or code that may be utilized to enable generation of calibration signals associated with various frequencies, for example f=frq1 and f=frq2.

The selector block 413 may comprise suitable circuitry, logic, and/or code that may be utilized to enable selection of one of a plurality of input signals to be output as modulation information 415 based on the Select Operation signal. In various embodiments of the invention, the selector block 413 may receive as inputs, a pre-distortion signal and a calibration signal, for example. Based on a value associated with the Select Operation signal, the selector block 413 may select either the pre-distortion signal, or the calibration signal. The selected signal may be output as modulation information 415 by the selector block 413.

The adder block 412 may comprise suitable circuitry, logic, and/or code that may be utilized to enable generation of a Carrier signal based on a plurality of input signals. The adder block 412 may generate the Carrier signal by summing input signals associated with the modulation information 415 and Channel Select signal.

In operation, a method for bandwidth calibration for a PLL may comprise a calibration phase, and a normal operation phase. In an exemplary embodiment of the invention, the calibration phase may comprise deriving bandwidth calibration information based on a calibration signal for f=frq1, and based on a calibration signal for f=frq2. In the calibration phase, the Select Operation signal may cause the selector 413 to select an input from the calibration signal generator 414. The calibration signal generator 414 may generate a calibration signal whose associated frequency is frq1. The adder block 412 may generate a Carrier signal based on the calibration signal. The fractional divider 210 may perform frequency division on the Modulated signal based on the received Carrier signal. Based on the frequency division, an Feedback signal may be generated. The phase to voltage converter 406 may generate a voltage signal based on a phase difference between the Feedback signal and the Reference signal. The A/D converter 407 may generate a digital representation for the generated voltage. The power estimator 408 may compute an estimated signal power level associated with the digital representation for the generated voltage signal. The BW calculation unit 410 may compare the estimated signal power level, for the frq1 signal, with reference information stored in the LUT 409.

The calibration signal generator 414 may generate a calibration signal whose associated frequency is frq2. By a process that is substantially as described above, the BW calculation unit 410 may compare the estimated signal power level, for the frq2 signal, with reference information stored in the LUT 409. Based on the calculations for the frq1 and frq2 signals, impairment information may be computed. Based on the impairment information, a pre-distortion signal may be generated based on a modulation type.

In the normal operation phase, the transmitter 130 or 150 may receive signals associated with various channel frequencies based on the Channel Select signal. The Select Operation signal may cause the Selector 413 to select an input from the modulation generation and pre-distortion block 411. The modulation information may be added to the received signal to generate the Carrier signal. The addition of the modulation information to the received signal in the Carrier signal may correct for impairments in an actual PLL that cause the actual transfer function to deviate from the ideal transfer function. As a result, a more predictable Modulated signal may be generated in various embodiments of the invention when compared to some conventional PLL designs.

In another exemplary embodiment of the invention, the calibration phase may comprise deriving bandwidth calibration information based on a calibration signal for f=frq1 or f=frq2, and based on a received signal for f=f$_{Sel}$. In the calibration phase, the Select Operation signal may cause the selector 413 to select an input from the calibration signal generator 414. The calibration signal generator 414 may generate a calibration signal whose associated frequency is frq1 or frq2. The adder block 412 may generate a Carrier signal based on the calibration signal. The fractional divider 210 may perform frequency division on the Modulated signal based on the received Carrier signal. Based on the frequency division, a Feedback signal may be generated. The phase to voltage converter 406 may generate a voltage signal based on a phase difference between the Feedback signal and the Reference signal. The A/D converter 407 may generate a digital representation for the generated voltage. The power estimator 408 may compute an estimated signal power level associated with the digital representation for the generated voltage signal. The BW calculation unit 410 may compare the estimated signal power level, for the frq1 or frq2 signal, with reference information stored in the LUT 409.

The adder block 412 may generate a Carrier signal based on the received signal whose associated frequency is f$_{Sel}$. By a process that is substantially as described above, the BW calculation unit 410 may compute a corresponding signal power level based on the received signal. From the computed signal power level, an estimated actual transfer function may be computed. An expectation value for the ideal transfer function associated with the frequency f=f$_{Sel}$ may be computed. Based on the expectation value, and on calculations for the frq1 or frq2 signals, impairment information may be computed. A pre-distortion signal may be generated substantially as described above. The normal operation phase may be substantially as described above.

In another exemplary embodiment of the invention, the calibration phase may comprise deriving bandwidth calibration information based on a calibration signal for f=frq1, and based on a calibration signal for f=frq2. The LUT 409 may store reference information based upon a ratio of calculations for the frq1 signal to calculations for the frq2 signal. In this exemplary embodiment, the pre-distortion signal may be computed based upon the ratio of calculations for the frq1 and frq2 signals. The normal operation phase may be substantially as described above.

Figure 5:
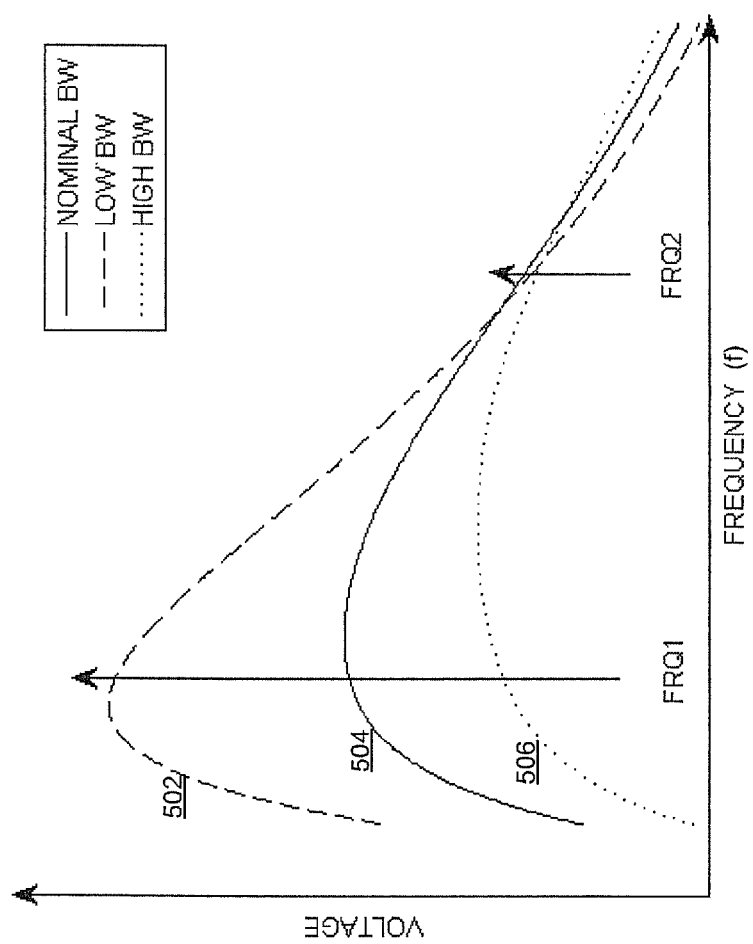
FIG. 5 is a diagram illustrating exemplary estimations based on corresponding actual transfer functions for a range of frequencies, which may be utilized in connection with an embodiment of the invention.

FIG. 5 is a diagram illustrating exemplary estimations based on corresponding actual transfer functions for a range of frequencies, which may be utilized in connection with an embodiment of the invention. Referring to FIG. 5, there are shown estimation values for actual transfer functions for a wide bandwidth PLL 502, for a nominal bandwidth PLL 504, and for a low bandwidth PLL 506. A wide bandwidth PLL may comprise a wider bandwidth PLL for example a PLL with frequency bandwidth close to fmax than may a nominal bandwidth PLL or a low bandwidth PLL. A nominal bandwidth PLL may comprise a wider bandwidth PLL for example a PLL with frequency bandwidth very close to f$_{BWideal}$ than may a low bandwidth PLL. The nominal bandwidth may represent the expected bandwidth associated with an ideal PLL for example a PLL with frequency bandwidth very close to f$_{BWideal}$. In FIG. 5, the vertical axis may represent a signal level, as measured in volts for example, associated with an output signal from the fractional divider 210 (for example the Feedback signal) based on the corresponding actual transfer function. The horizontal axis may represent a frequency range.

The frequency frq1 may be selected such that a small change in the value for the frequency bandwidth f$_{BW}$ may result in a comparatively large change in the corresponding signal level. The frequency frq2 may be selected such that a small change in the value for the frequency bandwidth f$_{BW}$ may result in a comparatively small change in the corresponding signal level.

Figure 6:
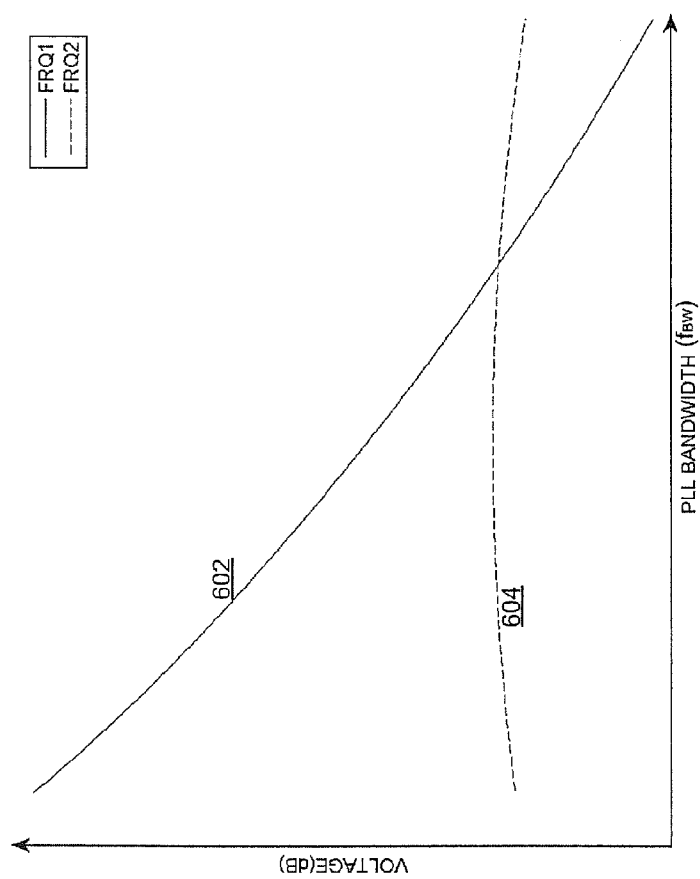
FIG. 6 is a diagram illustrating exemplary estimations based on corresponding actual transfer functions based on phase locked loop bandwidth, which may be utilized in connection with an embodiment of the invention.

FIG. 6 is a diagram illustrating exemplary estimations based on corresponding actual transfer functions based on phase locked loop bandwidth, which may be utilized in connection with an embodiment of the invention. Referring to FIG. 6, there are shown estimation values for actual transfer functions for various PLL bandwidths evaluated for f=frq1

602, and for f=frq2 604. In FIG. 6, the vertical axis may represent ratio for a signal level and a reference signal level, as measured in decibels (dB) for example, associated with an output signal from the fractional divider 210 based on the corresponding actual transfer function. The horizontal axis may represent a PLL bandwidth where bandwidth may be as described in equations[3a] and [3b], for example. The FIG. 6 may be derived from FIG. 5.

Figure 7:
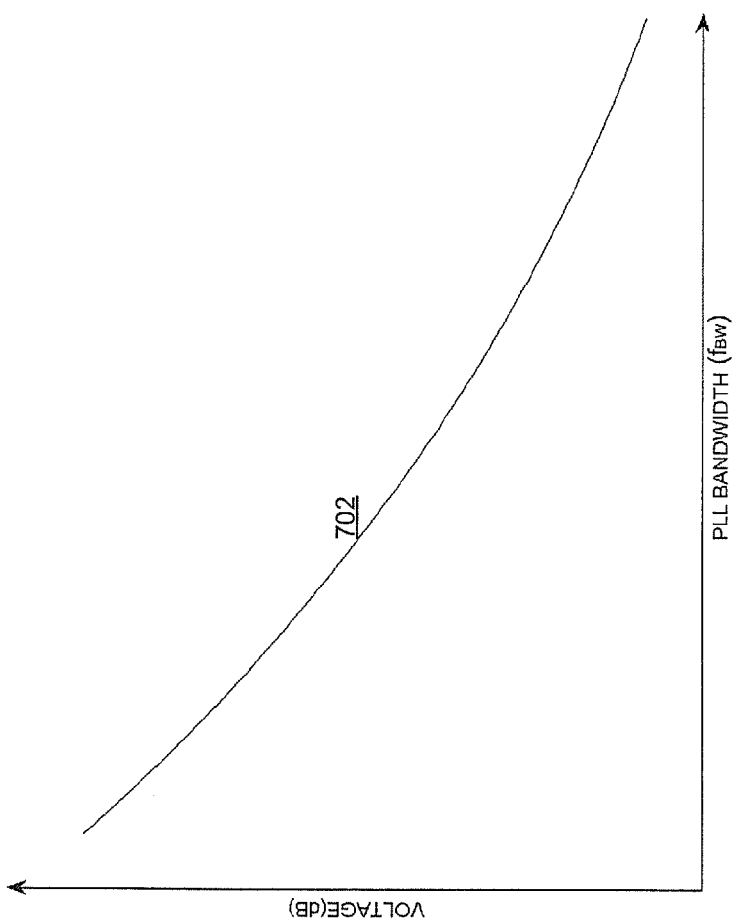
FIG. 7 is a diagram illustrating exemplary estimations based on ratios for corresponding actual transfer functions based on phase locked loop bandwidth, which may be utilized in connection with an embodiment of the invention.

FIG. 7 is a diagram illustrating exemplary estimations based on ratios for corresponding actual transfer functions based on phase locked loop bandwidth, which may be utilized in connection with an embodiment of the invention. Referring to FIG. 7, there is shown are estimation values based on a ratio of actual transfer functions for various PLL bandwidths evaluated for f=frq1 and for f=frq2 702. In FIG. 7, the vertical axis may represent ratio for a signal levels associated with the frequencies frq1 and frq2, as measured in decibels (dB) for example, associated with an output signal from the fractional divider 210 based on the corresponding actual transfer function. The horizontal axis may represent a PLL bandwidth where bandwidth may be as described in equations[3a] and [3b], for example. The FIG. 7 may be derived based on corresponding ratios for 602 and 604.

Figure 8:
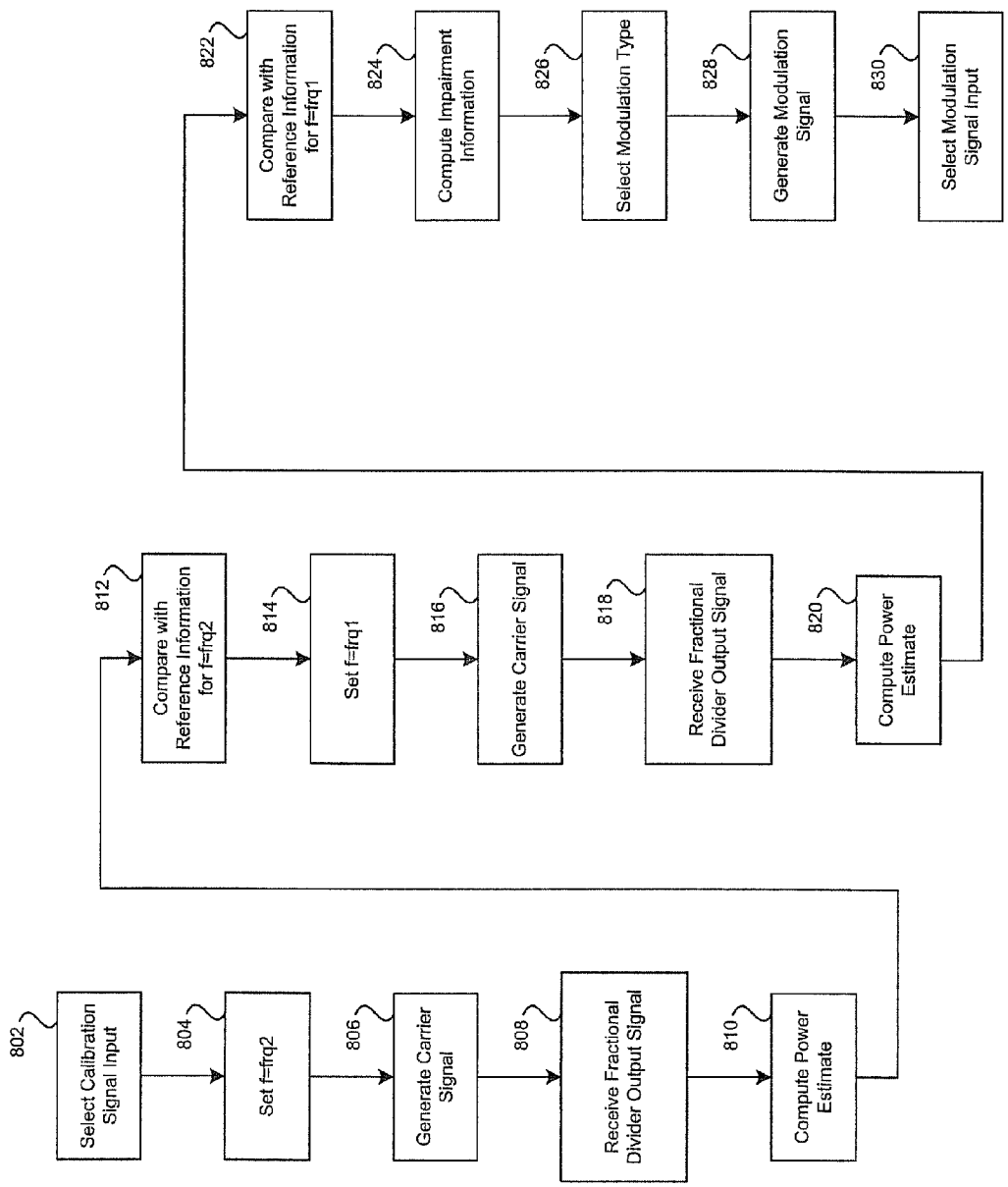
FIG. 8 is a flowchart illustrating exemplary steps for bandwidth calculation for a phase locked loop based on frq1 and frq2 responses, in accordance with an embodiment of the invention.

FIG. 8 is a flowchart illustrating exemplary steps for bandwidth calculation for a phase locked loop based on frq1 and frq2 responses, in accordance with an embodiment of the invention. Referring to FIG. 8A, in step 802 the selector 413 may select input from the calibration signal generator 414. In step 804, the signal for the calibration signal may be set to f=frq2. In step 806, a Carrier signal may be generated based on the calibration signal. In step 808, the Feedback signal from the fractional divider 210 may be received. In step 810, a power estimate may be computed. In step 812, the computed power estimate may be compared with reference information stored in the LUT 409 associated with the frequency f=frq2. In step 814, the signal for the calibration signal may be set to f=frq1. In step 816, a Carrier signal may be generated based on the calibration signal. In step 818, the Feedback signal from the fractional divider 210 may be received. In step 820, a power estimate may be computed. In step 822, the computed power estimate may be compared with reference information stored in the LUT 409 associated with the frequency f=frq1. In step 824, impairment information may be computed based on the calculations for frq1 and frq2. In step 826, a modulation type may be selected, for example, 16 QAM. In step 828, a modulation signal may be generated. In step 830, the selector 413 may select input from the modulation generation and pre-distortion block 411.

Aspects of a system for generating timing information may comprise an adder block 412 that enables generation, within a phase locked loop circuit (PLL) 174, of one or more carrier signals based on at least one corresponding calibration signal generated by a calibration signal generator 414. A modulation generation and pre-distortion block 411 may enable computation of a pre-distortion function for the PLL 174 circuit based on the generated one or more carrier signals. The carrier signal may be input to the fractional divider 210 that computes a Feedback signal that may be utilized to compute the pre-distortion function. A VCO 208 may enable modification of an output RF synthesized signal generated by the PLL 174 circuit based on the computed pre-distortion function. The pre-distortion function may be utilized to generate a carrier signal, which may be utilized by the fractional divider 210 to generate an Feedback signal. The input signal may be utilized to generate a control voltage the enables the VCO 208 to generate an output RF synthesized signal. The fractional divider 210 may enable generation, within the PLL 174 circuit, of a subsequent output RF synthesized signal based on the modified output RF synthesized signal. The fractional divider may frequency divide the output signal generated by the VCO 208 based on the carrier signal. The modified output RF synthesized signal generated by the fractional divider 210 may be utilized in by the phase comparator 204 to enable generation of a subsequent control voltage that enables the VCO 208 to generate the subsequent output RF synthesized signal.

The phase to voltage converter 406 may enable computation of one or more phase difference signals based on the one or more corresponding calibration signals. The analog to digital converter 407 may enable computation of one or more corresponding digital representations for the one or more phase difference signals. The power estimator 408 may enable computation of one or more signal power level estimates based on the one or more corresponding digital representations for the one or more phase difference signals. The bandwidth calculation unit 410 may enable computation of the pre-distortion function based on the one or more signal power level estimates and on corresponding reference information. The corresponding reference information may be stored in and/or retrieved from the LUT 409. The modulation generation and pre-distortion block 411 may enable generation of a modulation information signal based on the pre-distortion function and modulation data. The modulation data may be based on a modulation type, for example 16 QAM.

The adder block 412 may enable generation of a subsequent carrier signal based on a received signal and the generated modulation information signal. The received signal may be associated with a selected channel frequency whose frequency $f_{Sel}$ may be selected based on a Channel Select input signal. The received signal may be received by the transmitter 130 or 150. The fractional divider 410 may enable generation of the subsequent output signal based on the generated subsequent carrier signal. The adder block 412 may enable generation of at least a portion of the one or more carrier signals based on one or more received signals. In various embodiments of the invention, carrier signals may be generated to enable computation of calibration information based on a calibration signal for frequencies f=frq1 or f=frq2, and based on a received signal for frequency $f=f_{Sel}$. The bandwidth calculation unit 410 may enable computation of the pre-distortion information base on the one or more received signals, the one or more corresponding calibration signals, and reference information. The reference information may be stored in and/or retrieved from the LUT 409.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for generating signals in a wireless communication system, the method comprising:
    generating a carrier signal based on an input calibration signal;
    performing frequency division on a modulated signal based on said carrier signal;
    generating a feedback signal based on said frequency division;
    computing a feedback signal power level based on said feedback signal;
    computing an estimated signal transfer function based on a ratio of said computed feedback signal power level and a computed calibration signal power level;
    computing a predistortion value based on said computed estimated signal transfer function; and
    modifying a modulation data signal based on said computed predistortion value.

2. The method according to claim 1, further comprising selecting said input calibration signal during a calibrations phase.

3. The method according to claim 1, comprising computing an ideal signal transfer function based on a ratio of an ideal feedback signal power level and said computed calibration signal power level, wherein said ideal feedback signal power level corresponds to said computed feedback signal power level.

4. The method according to claim 3, comprising computing an impairment measurement based on said estimated signal transfer function and said ideal signal transfer function.

5. The method according to claim 4, wherein said computing said predistortion value comprises computing said predistortion value based on said impairment measurement.

6. The method according to claim 5, wherein said modifying said modulation data signal comprises modifying said modulation data signal during a normal operation phase.

7. The method according to claim 6, comprising generating a subsequent carrier signal based on said modified modulation data signal.

8. The method according to claim 5, comprising selecting a frequency for computing said estimated signal transfer function, said ideal signal transfer function, said impairment measurement and/or said predistortion value.

9. The method according to claim 8, comprising computing said estimated signal transfer function, said ideal signal transfer function, said impairment measurement and/or said predistortion value for a subsequent frequency based on said computing said estimated signal transfer function, said ideal signal transfer function, said impairment measurement, and/or said predistortion value for said selected frequency.

10. A system for generating signals in a wireless communication system, the system comprising:
    a processor and/or circuit configured to:
    generate a carrier signal based on an input calibration signal;
    perform frequency division on a modulated signal based on said carrier signal;
    generate a feedback signal based on said frequency division;
    compute a feedback signal power level based on said feedback signal;
    compute an estimated signal transfer function based on a ratio of said computed feedback signal power level and a computed calibration signal power level;
    compute a predistortion value based on said computed estimated signal transfer function; and
    modify a modulation data signal based on said computed predistortion value.

11. The system according to claim 10, wherein said processor and/or circuit is further configured to select said input calibration signal during a calibrations phase.

12. The system according to claim 10, wherein said processor and/or circuit is further configured to compute an ideal signal transfer function based on a ratio of an ideal feedback signal power level and said computed calibration signal power level, wherein said ideal feedback signal power level corresponds to said computed feedback signal power level.

13. The system according to claim 12, wherein said processor and/or circuit is further configured to compute an impairment measurement based on said estimated signal transfer function and said ideal signal transfer function.

14. The system according to claim 13, wherein said processor and/or circuit is configured to compute said predistortion value based on said impairment measurement.

15. The system according to claim 14, wherein said processor and/or circuit is configured to modify said modulation data signal during a normal operation phase.

16. The system according to claim 15, wherein said processor and/or circuit is further configured to generate a subsequent carrier signal based on said modified modulation data signal.

17. The system according to claim 14, wherein said processor and/or circuit is further configured to compute a frequency for computing said estimated signal transfer function, said ideal signal transfer function, said impairment measurement and/or said predistortion value.

18. The system according to claim 17, wherein said processor and/or circuit is configured to compute said estimated signal transfer function, said ideal signal transfer function, said impairment measurement, and/or said predistortion value for a subsequent frequency based on said computing said estimated signal transfer function, said ideal signal transfer function, said impairment measurement, and/or said predistortion value for said selected frequency.

* * * * *

UNITED STATES PATENT AND TRADEMARK OFFICE
CERTIFICATE OF CORRECTION

PATENT NO. : 8,494,085 B2
APPLICATION NO. : 12/824586
DATED : July 23, 2013
INVENTOR(S) : Sofoklis Plevridis It is certified that error appears in the above-identified patent and that said Letters Patent is hereby corrected as shown below:

In the Claims:

Column 19, Line 57, please replace "measurement and/or" with --measurement, and/or--.

Column 19, Line 60, please replace "measurement and/or" with --measurement, and/or--.

Column 20, Lines 50-51, please replace "measurement and/or" with --measurement, and/or--.

Signed and Sealed this
Fifteenth Day of October, 2013

Teresa Stanek Rea
*Deputy Director of the United States Patent and Trademark Office*